(12) United States Patent
Huang et al.

(10) Patent No.: US 11,703,766 B2
(45) Date of Patent: **\*Jul. 18, 2023**

(54) MATERIALS AND METHODS FOR FORMING RESIST BOTTOM LAYER

(71) Applicant: Taiwan Semiconductor Manufacturing Co., Ltd., Hsin-Chu (TW)

(72) Inventors: Jing Hong Huang, Hsinchu (TW); Chien-Wei Wang, Hsinchu County (TW); Shang-Wern Chang, Hsinchu County (TW); Ching-Yu Chang, Yilang County (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/814,773

(22) Filed: Jul. 25, 2022

(65) Prior Publication Data

US 2022/0373891 A1 Nov. 24, 2022

Related U.S. Application Data

(63) Continuation of application No. 16/414,648, filed on May 16, 2019, now Pat. No. 11,442,364.

(60) Provisional application No. 62/691,075, filed on Jun. 28, 2018.

(51) Int. Cl.
*G03F 7/38* (2006.01)

(52) U.S. Cl.
CPC .................................... *G03F 7/38* (2013.01)

(58) Field of Classification Search
CPC .................................... G03F 7/11; G03F 7/40
See application file for complete search history.

(56) References Cited

U.S. PATENT DOCUMENTS

| | | | |
|---|---|---|---|
| 8,796,666 | B1 | 8/2014 | Huang et al. |
| 9,093,530 | B2 | 7/2015 | Huang et al. |
| 9,213,234 | B2 | 12/2015 | Chang |
| 9,223,220 | B2 | 12/2015 | Chang |
| 9,256,133 | B2 | 2/2016 | Chang |
| 9,536,759 | B2 | 1/2017 | Yang et al. |
| 9,548,303 | B2 | 1/2017 | Lee et al. |
| 9,857,684 | B2 | 1/2018 | Lin et al. |
| 9,859,206 | B2 | 1/2018 | Yu et al. |
| 9,875,892 | B2 | 1/2018 | Chang et al. |

(Continued)

FOREIGN PATENT DOCUMENTS

WO WO 2016175103 A1 11/2016

*Primary Examiner* — Duane Smith
*Assistant Examiner* — Nicholas E Brown
(74) *Attorney, Agent, or Firm* — Haynes and Boone, LLP

(57) ABSTRACT

A method includes forming a bottom layer over a semiconductor substrate, where the bottom layer includes a polymer bonded to a first cross-linker and a second cross-linker, the first cross-linker being configured to be activated by ultraviolet (UV) radiation and the second cross-linker being configured to be activated by heat at a first temperature. The method then proceeds to exposing the bottom layer to a UV source to activate the first cross-linker, resulting in an exposed bottom layer, where the exposing activates the first cross-linker. The method further includes baking the exposed bottom layer, where the baking activates the second cross-linker.

20 Claims, 8 Drawing Sheets

(56) References Cited

U.S. PATENT DOCUMENTS

| | | | |
|---|---|---|---|
| 11,442,364 B2* | 9/2022 | Huang | G03F 7/16 |
| 2014/0335692 A1 | 11/2014 | Nonaka et al. | |
| 2015/0187565 A1* | 7/2015 | Su | H01L 21/0276 |
| | | | 438/780 |
| 2017/0069496 A1* | 3/2017 | Liu | H01L 21/31058 |

* cited by examiner

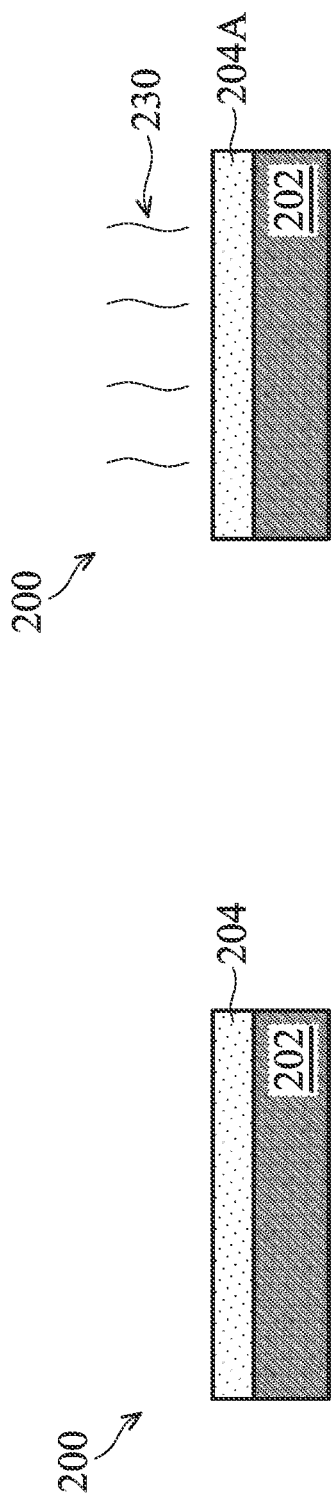
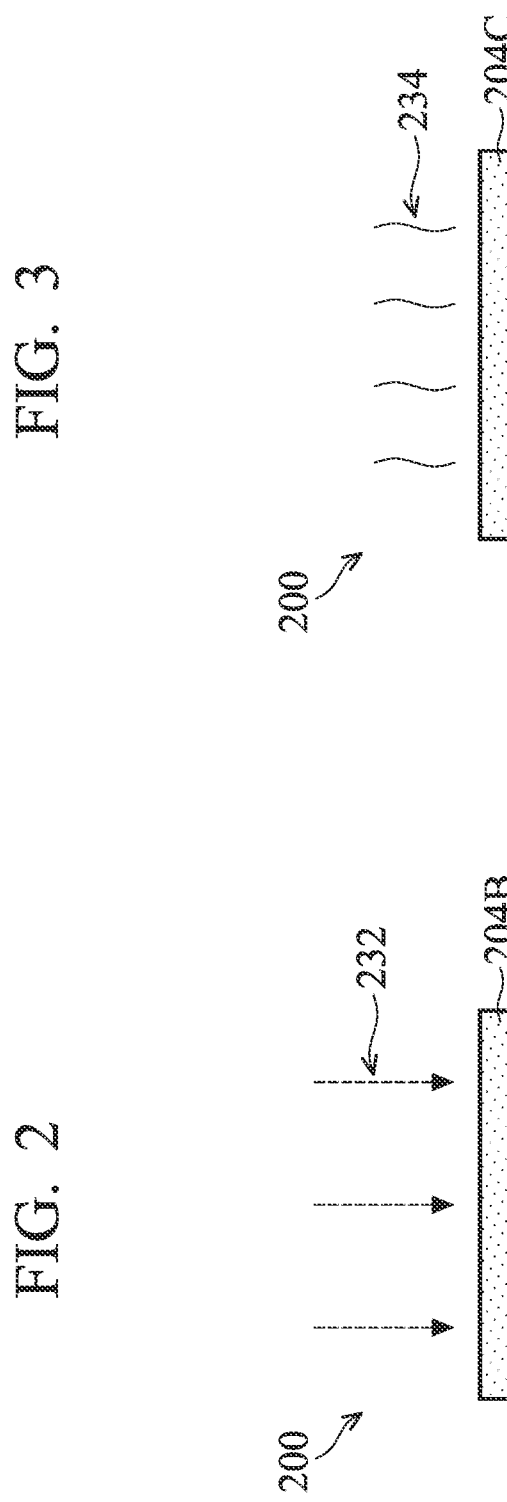
FIG. 2
FIG. 3
FIG. 4
FIG. 5

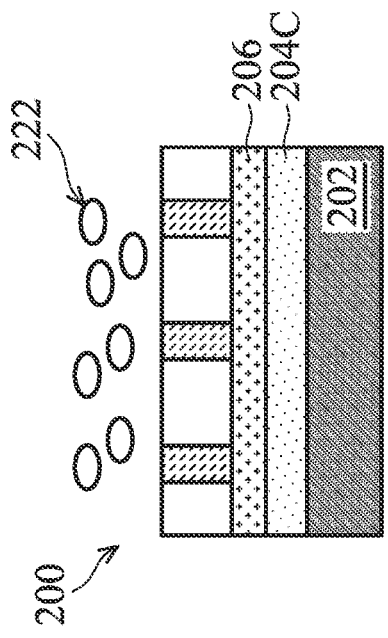
FIG. 12
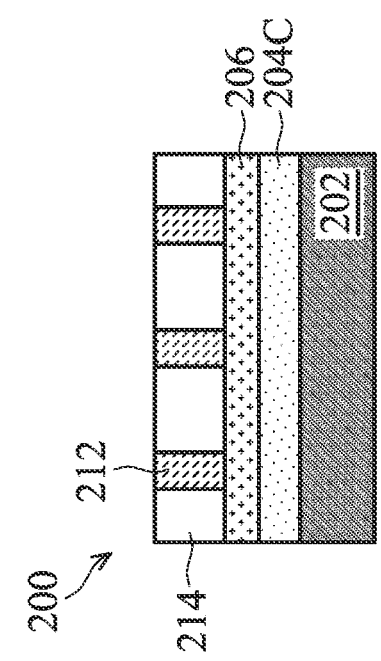
FIG. 13
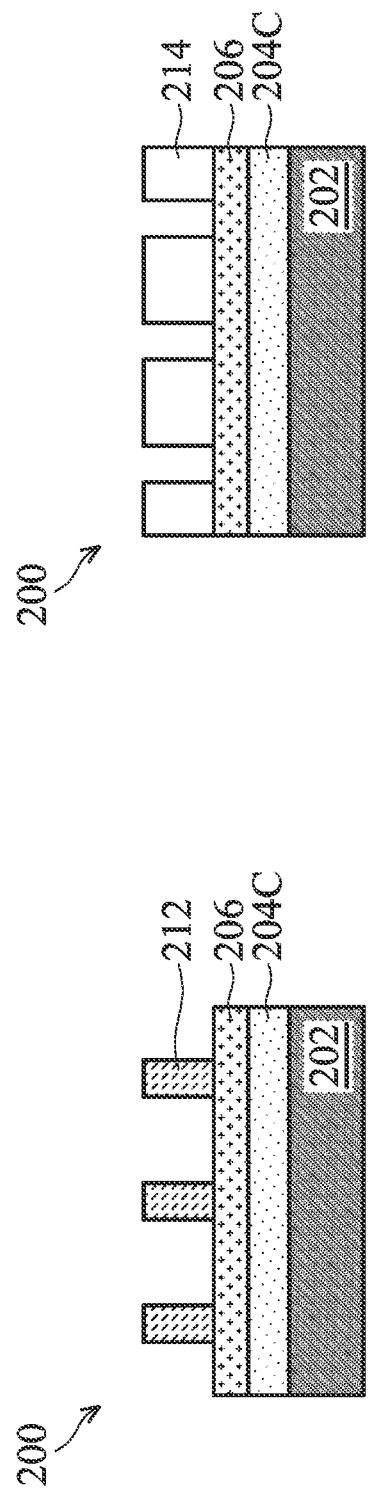
FIG. 14A
FIG. 14B

MATERIALS AND METHODS FOR FORMING RESIST BOTTOM LAYER

CROSS-REFERENCE TO RELATED APPLICATIONS

This is a continuation application of U.S. application Ser. No. 16/414,648, filed May 16, 2019, which claims priority to U.S. Provisional Patent Application Ser. No. 62/691,075, filed Jun. 28, 2018, each of which is herein incorporated by reference in its entirety.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased. As sizes of lithographic features are reduced, higher numerical aperture processes are needed to overcome the resolution limit.

Lithographic multi-layer structures having a photosensitive top layer formed over at least a bottom layer have been implemented to address challenges associated with photolithography patterning processes. While methods of forming multi-layer structures have been generally adequate, they have not been entirely satisfactory in all aspects. For example, incomplete curing of the bottom layer by a light source may lead to non-uniform etching rate when a final pattern is transferred from the bottom layer to an underlying substrate. Thus, improvements in this aspect are desired.

BRIEF DESCRIPTION OF THE DRAWINGS

Aspects of the present disclosure are best understood from the following detailed description when read in association with the accompanying figures. It is noted that, in accordance with the standard practice in the industry, various features in the drawings are not drawn to scale. In fact, the dimensions of illustrated features may be arbitrarily increased or decreased for clarity of discussion.

FIGS. 2, 3, 4, 5, 9, 10, 11, 12, 13, 14A and 14B are cross-sectional side views of an example semiconductor device at different steps of the method of FIGS. 1A and 1B according to various aspects of the present disclosure.

DETAILED DESCRIPTION

Figure 1A:
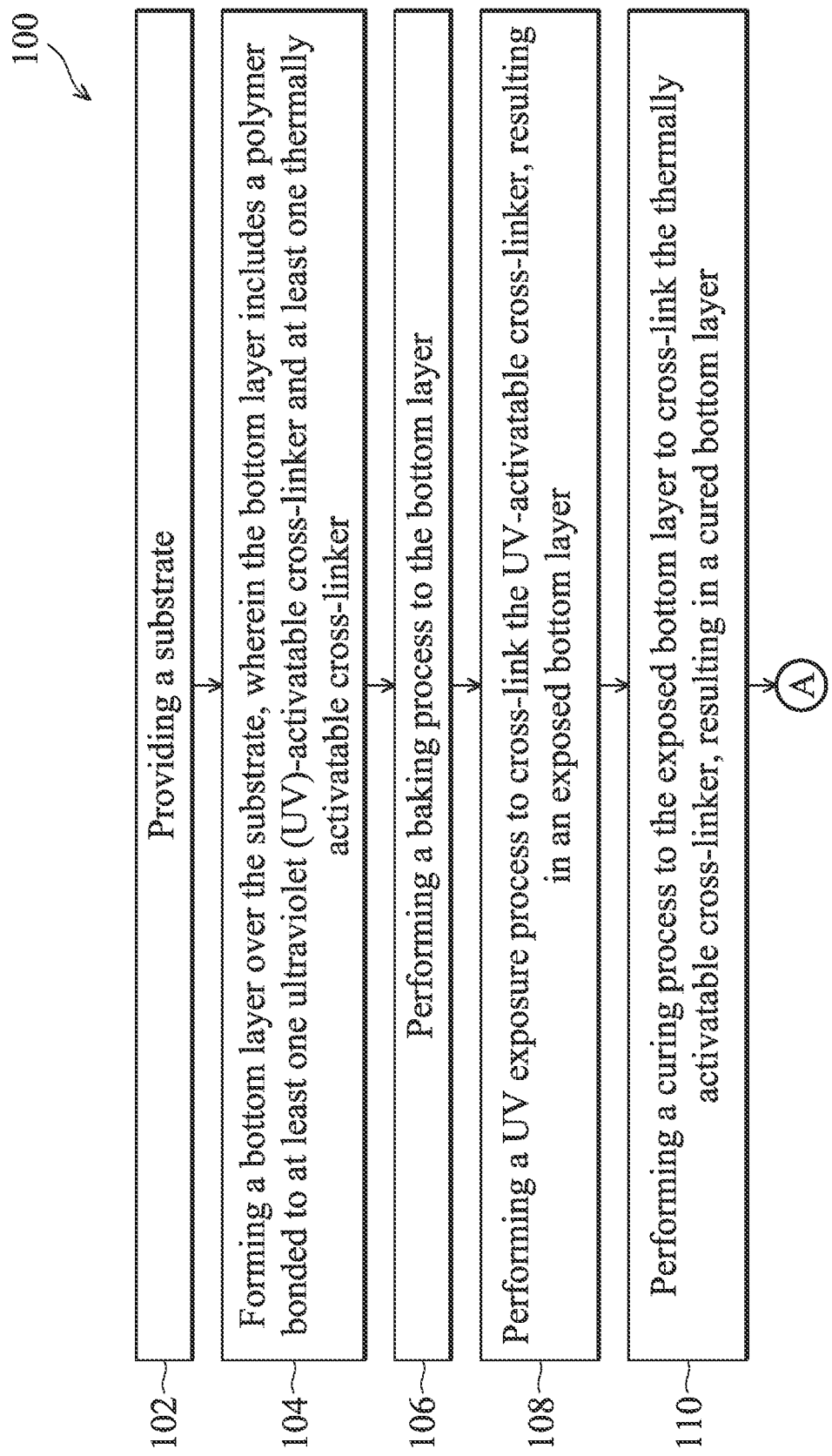
FIGS. 1A and 1B illustrate a flowchart of a method for fabricating an example semiconductor device according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure relates generally to IC device manufacturing and, more particularly, to materials and methods of forming resist (e.g., photoresist) bottom layers. Many resists used for patterning a semiconductor substrate are multi-layered structures that include at least a bottom layer (e.g., a bottom anti-reflective coating, or BARC) disposed over the substrate and a top layer (e.g., a photosensitive top layer) disposed over the bottom layer. Optionally, the resist may further include other material layers such as at least one middle layer (e.g., a hard mask layer) disposed between the bottom layer and the top layer. Using such multi-layered resists in lithography processes has demonstrated advantages in minimizing substrate reflectivity of a radiation (e.g., light) source and improving etching selectivity between various underlying layers. However, improvements in many aspects of the multi-layered resists for advanced patterning processes are still desired. For example, it has been observed that polymeric materials cross-linked by ultraviolet (UV) radiation to form the bottom layer can demonstrate non-uniform curing (by, for example, cross-linking) upon UV exposure. The effect of non-uniform curing is especially prevalent when the semiconductor substrates include structures (e.g., conductive features, spacers, mandrels, etc.) having spacing less than a wavelength of the UV radiation. As a result, after a pattern is formed in the resist top layer and subsequently transferred to the bottom layer, uncured portions of the bottom layer may not be properly etched, leading to compromised pattern quality. As demonstrated by embodiments below, incorporating both UV-activatable cross-linkers and thermally activatable cross-linkers in the bottom layer improves the extent of curing after the bottom layer is subjected to both UV and heat exposure configured to activate the respective cross-linkers.

Figure 1B:
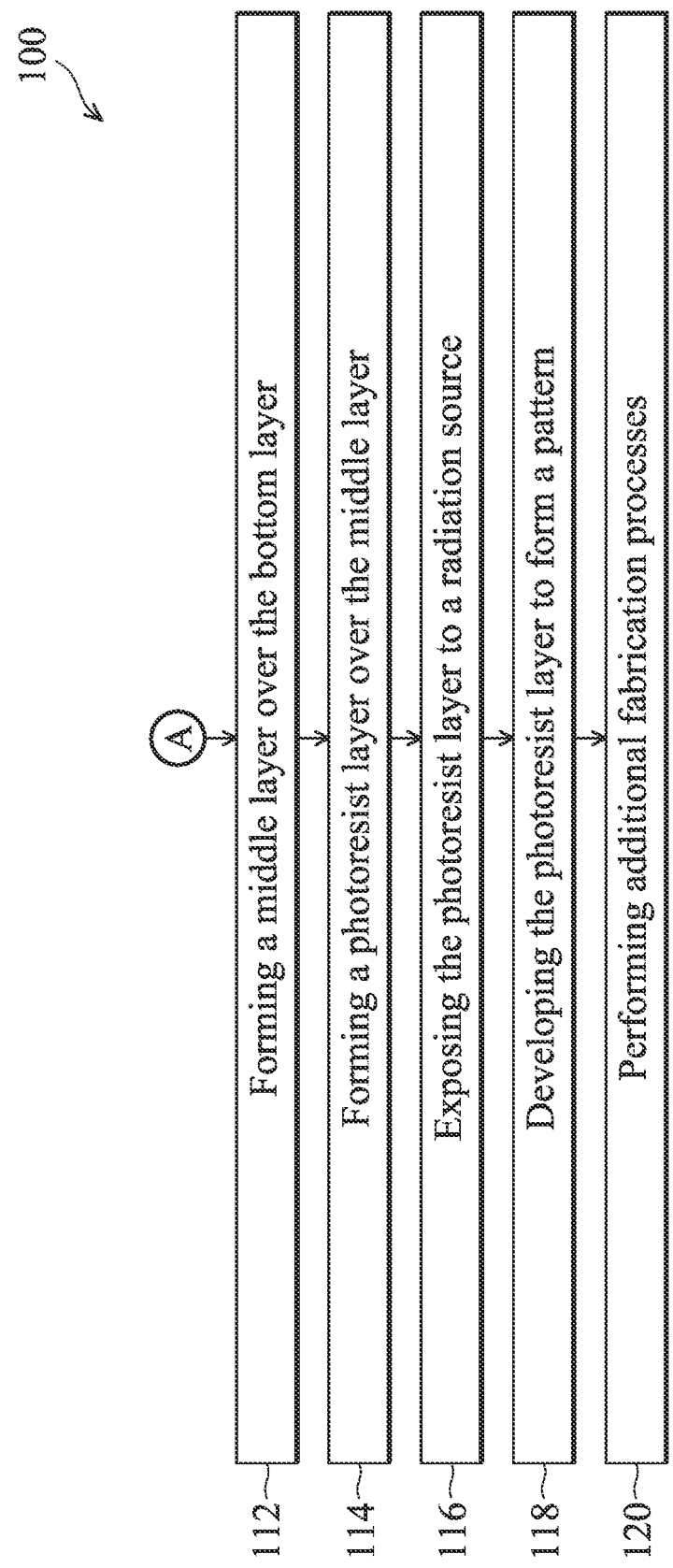
Figure 6:
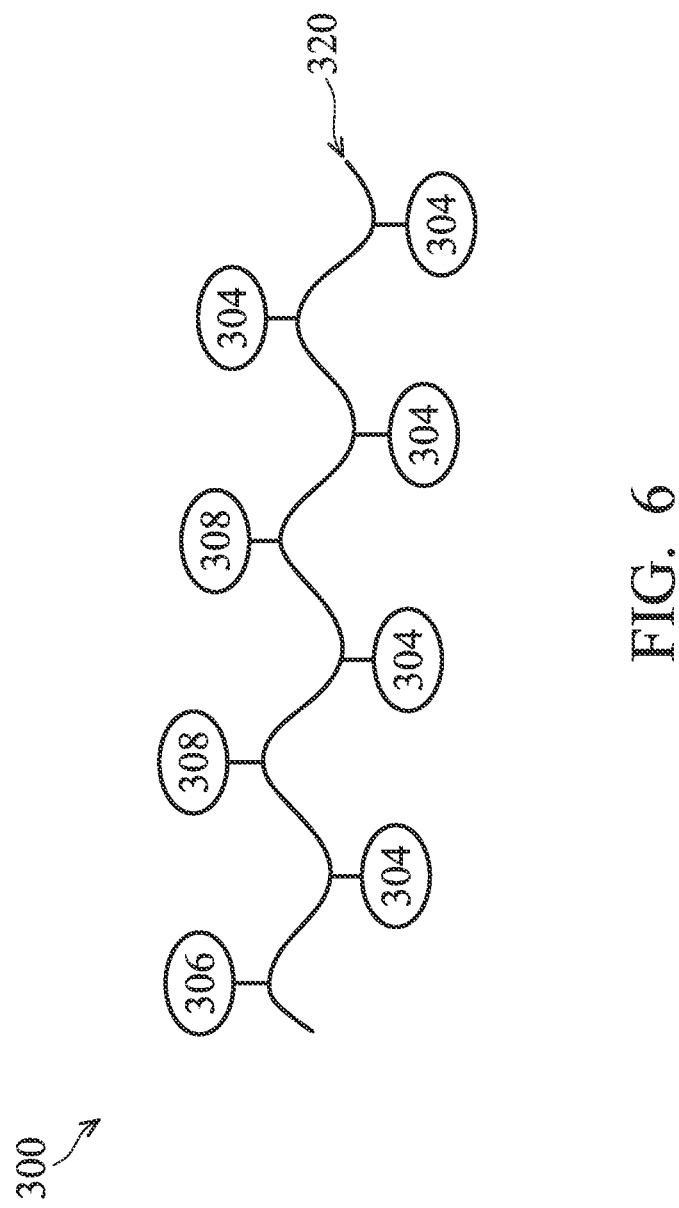
FIGS. 6, 7, and 8 illustrate example chemical structures according to various aspects of the present disclosure.
Figure 7:
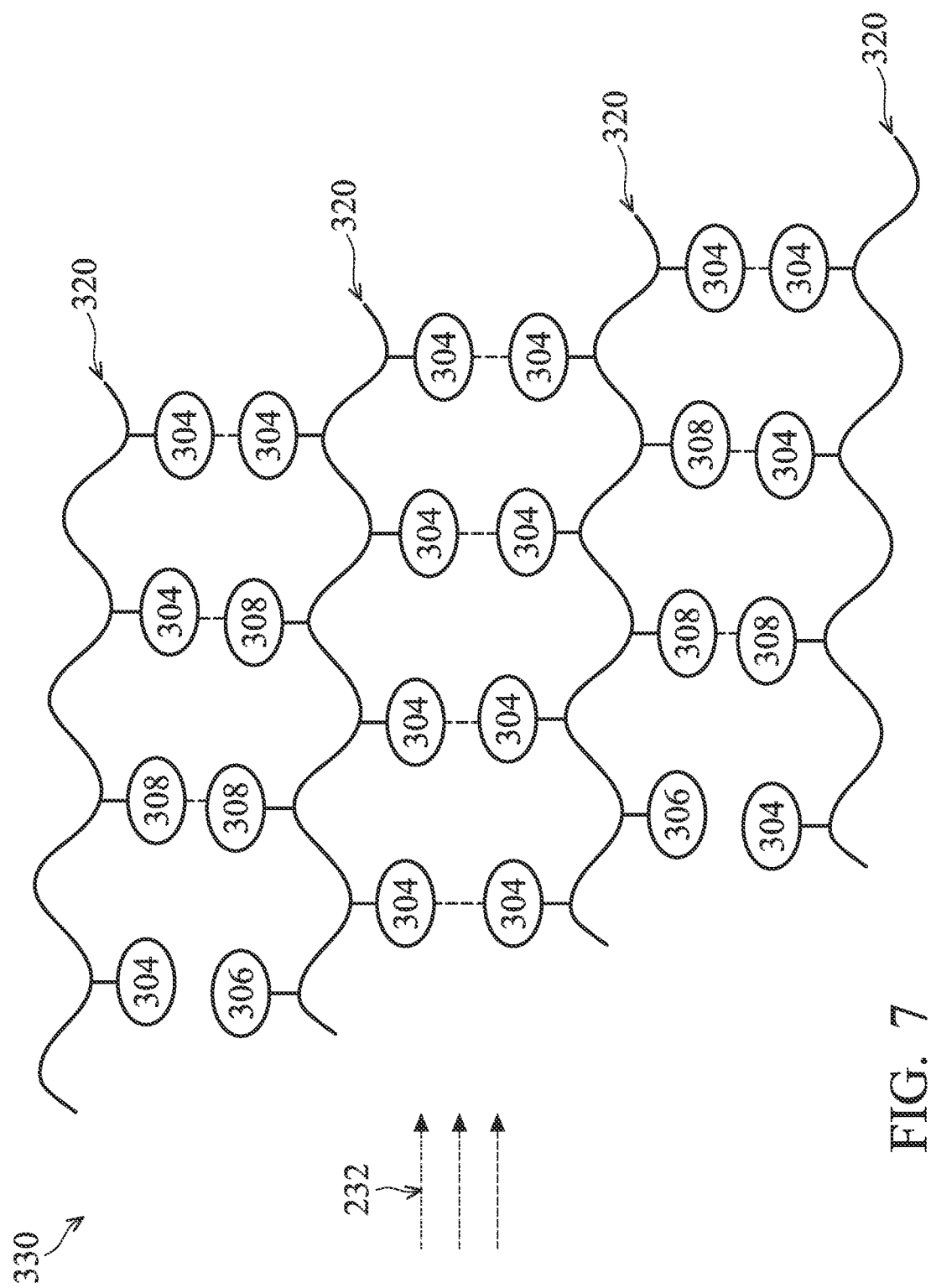
Figure 8:
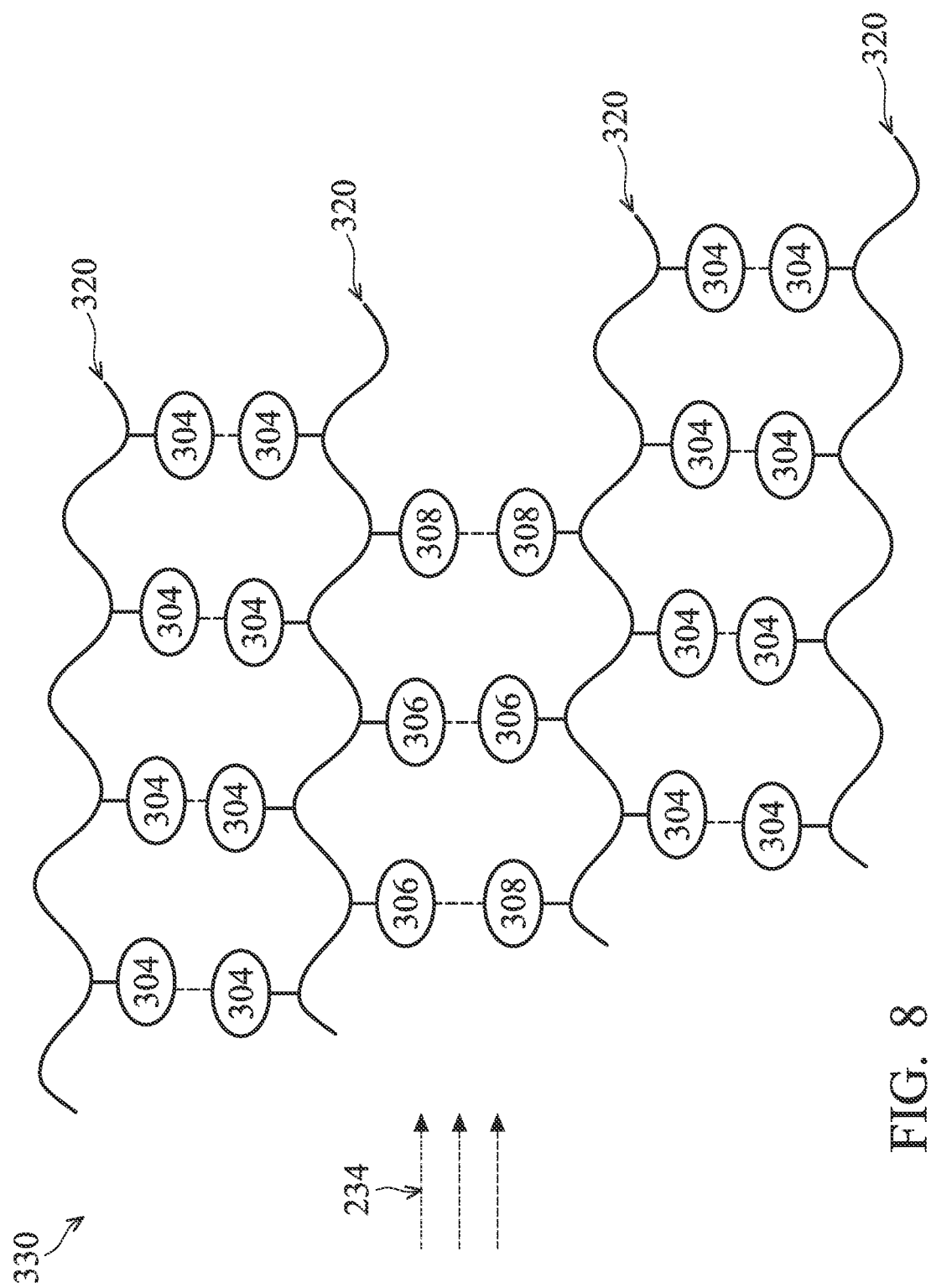

FIGS. 1A and 1B illustrate a flowchart of a method 100 for processing a workpiece 200 according to some aspects of the present disclosure. The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the process. Intermediate steps of the method 100 are described with reference to cross-sectional side views of the workpiece 200 as shown in FIGS. 2-5 and 9-14B, while schematic representations of example chemical structures and reactions are shown in FIGS. 6-8. For clarity and ease of explanation, some elements of the figures have been simplified.

Referring to FIGS. 1A and 2, the method 100 provides (or is provided with) a substrate 202 at operation 102. The substrate 202 may comprise an elementary (single element) semiconductor, such as silicon in a crystalline structure and/or germanium in a crystalline structure; a compound semiconductor, such as silicon carbide, gallium arsenic, gallium phosphide, indium phosphide, indium arsenide, and/or indium antimonide; an alloy semiconductor such as SiGe, GaAsP, AlInAs, AlGaAs, GaInAs, GaInP, and/or GaInAsP; a non-semiconductor material, such as soda-lime glass, fused silica, fused quartz, and/or calcium fluoride ($CaF_2$); and/or combinations thereof.

The substrate 202 may be a single-layer material having a uniform composition. Alternatively, the substrate 202 may include multiple material layers having similar or different compositions suitable for IC device manufacturing. In one example, the substrate 202 may be a silicon-on-insulator (SOI) substrate having a semiconductor silicon layer formed on a silicon oxide layer. In another example, the substrate 202 may include a conductive layer, a semiconductor layer, a dielectric layer, other layers, and/or combinations thereof. In some embodiments, the substrate 202 may be a silicon wafer having a substantially flat surface. In some embodiments, the substrate 202 may include features such as spacers or mandrels that may be patterned and subsequently removed to accommodate additional processing steps.

The substrate 202 may include various circuit features formed thereon or therein including, for example, field effect transistors (FETs), metal-oxide semiconductor field effect transistors (MOSFETs), CMOS transistors, high voltage transistors, high frequency transistors, bipolar junction transistors, diodes, resistors, capacitors, inductors, varactors, other suitable devices, and/or combinations thereof. In some examples, the substrate 202 may include a plurality of three-dimensional active regions, or fins, a plurality of gate structures, and/or a plurality of spacers or mandrels.

In some embodiments where the substrate 202 includes FETs, various doped regions, such as source/drain regions, are formed in or on the substrate 202. The doped regions may be doped with n-type dopants, such as phosphorus or arsenic, and/or p-type dopants, such as boron or $BF_2$, depending on design requirements. The doped regions may be planar or non-planar (e.g., in a fin-like FET or FinFET) and may be formed directly on the substrate 202, in a p-well structure, in an n-well structure, in a dual-well structure, or using a raised structure. Doped regions may be formed by implantation of dopant atoms, in-situ doped epitaxial growth, and/or other suitable techniques.

Still referring to FIGS. 1A and 2, the method 100 forms a bottom layer 204 (or a first layer) over the substrate 202 at operation 104. In many embodiments, the bottom layer 204 is a bottom anti-reflective coating (BARC) material whose composition is chosen to minimize reflectivity of a radiation source implemented during exposure of a subsequently-formed resist layer (e.g., photoresist layer 208 in FIG. 4). Referring to FIG. 6, the bottom layer 204 includes a polymer 300 having a polymer backbone 320 bonded to a plurality of cross-linking moieties (referred to as cross-linkers hereafter) 304, 306, and/or 308 that may be activated to cross-link with a neighboring cross-linker in response to one or more external stimulations. In many embodiments, the polymer 300 includes cross-linkers 304 and one or both of the cross-linkers 306 and 308 bonded to the polymer backbone 320.

Specifically, the polymer backbone 320 may include an acrylate-based polymer, a poly(norbornene)-co-maleic anhydride (COMA) polymer, a poly(hydroxystyrene)-based polymer, other suitable polymers, or combinations thereof having any number of functional groups that may assist one or more subsequent exposure and developing processes. In one example, the functional groups may include lithographically sensitive groups (e.g., sensitizers) such as phenol, styrene, fluoride, and/or other suitable groups. In many embodiments, the functional groups include acid-labile groups (ALGs) configured to be cleavable from the polymer backbone by an acidic moiety.

The cross-linker 304 is an ultraviolet (UV) activatable cross-linker (i.e., it is configured to be activated by a UV source). In other words, the cross-linker 304 is operable to cross-link with another cross-linker when exposed to a UV source having a wavelength ranging from about 160 nm to about 300 nm that is configured to initiate the cross-linking reaction of the cross-linker 304. It is understood that such range of wavelengths is not limiting and, depending on the chemical composition of the cross-linker 304, a UV source having other wavelengths may also be applicable. In some embodiments, the cross-linker 304 cross-links with another cross-linker similar to itself upon exposure to a UV source. Alternatively, the cross-linker 304 cross-links with another cross-linker different from itself upon exposure to a UV source.

The cross-linker 304 may include the following structure: $H_2C$=$CH$—$R$—, where R denotes a portion of the cross-linker that bonds to the polymer backbone 320. In many embodiments, R is a functional group that includes a pi bond configured to conjugate with $H_2C$=$CH$—. Non-limiting examples of R include —(C=O)—, —(C=O)—O—, —CH=CH—, phenyl, phenol, other suitable functional groups, or combinations thereof. In many embodiments, a wavelength of the UV source operable to activate the cross-linker 304 depends upon the chemical composition of R in the cross-linker 304. As a result, the chemical composition of the cross-linker 304 may be selected based on a range of stable UV wavelengths available. Conversely, the UV source may be selected based on the chemical compositions of R in one or more cross-linkers 304 bonded to the polymer backbone 320. Upon exposure, the $H_2C$=$CH$— portion of the cross-linker 304 forms a —$H_2C$—$CH$— (i.e., a carbon-carbon covalent bond) with another cross-linker similar to or different from itself bonded to a different polymer backbone 320 via an addition reaction, constituting a carbon-based network of polymer backbones 320 connected by cross-linkers 304.

The cross-linker 306 is different from the cross-linker 304 and is a thermal activatable cross-linker (i.e., it is configured to be activated by a heating source). In other words, the cross-linker 306 is operable to cross-link with another cross-linker when exposed to a heating source. The cross-linker 306, depending upon its specific chemical composition, is configured to be activated only when a threshold temperature is reached. If the temperature is below the threshold temperature, not enough thermal energy is imparted onto the cross-linker 306 to initiate the breaking and the forming of chemical bonds. The cross-linker 306 may cross-link with another cross-linker having a similar chemical composition. Alternatively, the cross-linker 306 may cross-link with another cross-linker having a different chemical composition. The cross-linker 306 may include any suitable functional groups such as phenyl, alkyl-substituted phenyl, epoxide, hydroxyl, ether, ester, phenol-formaldehyde resin (such as novalac), other suitable functional groups, or combinations thereof. In some examples, the threshold temperature for the cross-linker 306 may be from about 150 degrees Celsius to about 250 degrees Celsius, depending upon the specific chemistry of the cross-linker 306. Of course, other threshold temperatures may also be applicable in the present disclosure depending upon the specific chemistry of the cross-linker 306.

The cross-linker 308 is a UV-thermal hybrid cross-linker configured to be activated by a UV source, a heating source, or both a UV source and a heating source. In other words, the cross-linker 308 is operable to cross-link with another cross-linker when exposed to a UV source and/or is operable to cross-link with another cross-linker when temperature is elevated above the cross-linker 308's threshold temperature. Therefore, in the depicted embodiment, the cross-linker 308 may cross-link with, for example, another cross-linker 308, a cross-linker 304, or a cross-linker 306. For example, the cross-linker 308 may be configured to bond with a cross-linker 304 (i.e., a UV-activatable cross-linker) during a UV exposure process. Alternatively, the cross-linker 306 may be configured to bond with a cross-linker 306 (i.e., a thermal activatable cross-linker).

The cross-linker 308 may include the following structure:

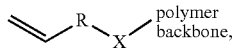

where R may include —(C=O)—, —(C=O)—O—, —CH=CH—, phenyl, phenol, other suitable functional groups, or combinations thereof as discussed above, and X is a portion configured to be thermally activated. X may be an alkyl chain (such as (—CH$_2$—)$_n$, where n is from 2 to 6, other alkyl structures, or combinations thereof), an aromatic ring (such as benzene, phenol, aniline, toluene, xylene, other aromatic structures, or combinations thereof), a heteroaromatic ring (such as furan, thiophene, pyridine, indole, other heteroaromatic rings, or combinations thereof), other suitable functional groups, or combinations thereof. The cross-linker 308 may be activated by a UV source having a wavelength (or a range of wavelengths) operable to initiate a chemical reaction in the H$_2$C=CH—R-portion of the cross-linker 308, similar to the cross-linker 304. Additionally or alternatively, the cross-linker 308 may be activated by a heating source that elevates to a temperature above the cross-linker 308's threshold temperature to initiate a chemical reaction in the X portion of the cross-linker 308.

Once thermally activated, the cross-linker 306 forms a covalent bond (i.e., cross-links) with another cross-linker similar to or different from itself bonded to a different polymer backbone 320 and may produce one or more reaction by-products. Because these by-products are eliminated from the bottom layer 204 (by, for example, evaporation) once the cross-linking reactions are completed, shrinkage of the bottom layer 204 may occur. For example, by-products including small molecule species, such as methanol, ethanol, water, etc., may evaporate during condensation-based cross-linking reactions, thereby inducing shrinkage of the bottom layer 204. However, the UV-activated cross-linking reactions, such as those involving the cross-linker 304, produce little to none by-products (i.e., comparatively much less than those produced by reacting the cross-linker 306). Instead, they form carbon-carbon (e.g., carbon single bonds) framework that experience little to none shrinkage upon completion of the cross-linking reaction. Accordingly, in order to prevent film collapse and/or a lack of uniformity in film thickness, the polymer 300 includes a higher amount of the cross-linkers 304 and/or 308 than the cross-linker 306. In one example, an amount of the cross-linker 306 included in the bottom layer 204 may be about 25% to about 67% that of the cross-linkers 304 and/or 308. An amount greater than about 67% may lead to film collapse of the bottom layer 204, while an amount less than about 25% may not fully cure a bottom portion of the polymer 300 that lacks exposure to the UV radiation.

Still referring to FIGS. 1A and 2, the bottom layer 204 may be formed by spin-coating the polymer 300 onto a top surface of the substrate 202 (or a top surface of the topmost material layer of a multi-layer substrate 202). A spin-coating process may use centrifugal force to disperse the polymer 300 in a liquid form across the top surface of the substrate 202 to a uniform thickness. To facilitate application, the polymer 300 may be dissolved in a solvent, which when removed, forms the bottom layer 204 in a solid or a semi-solid form (for example, a film). The solvent may be one or more of the following: propylene glycol methyl ether acetate, propylene glycol monomethyl ether, gamma-butyrolactone, ethyl lactate, cyclohexanone, n-butyl actetate, ethyl ketone, dimethyl formamide, alcohol (e.g., isopropyl alcohol or ethanol), other suitable solvents, or combinations thereof. The solvent may be driven off as part of the spin-coating process, during a settling process, and/or during a subsequent baking process.

Referring back to FIGS. 1A and 3, the method 100 performs a baking process 230 to the workpiece 200 at operation 106, thereby forming a baked bottom layer 204A. The baking process 230 is implemented at a temperature below the threshold temperature of the cross-linker 306 and/or the cross-linker 308, such that no cross-linker is activated to break or form chemical bonds with neighboring cross-linkers. Instead, the baking process 230 may be configured to reduce stress and/or strain introduced during the spin-coating process, facilitate thermal reflow to achieve planarity (i.e., smooth the top surface) of the bottom layer 204, and/or promote filling (e.g., gap filling) of the bottom layer 204 over structures of the substrate 202. In one example, the baking process 230 may be implemented at a temperature from about 50 degrees Celsius to about 200 degrees Celsius. Other temperatures may also be applicable for implementing the baking process 230. Any temperatures lower than about 50 degrees Celsius may not provide sufficient thermal energy to the polymer 300 to, for example, enable thermal reflow at the top surface of the bottom layer 204. In some embodiments, the baking process 230 may be omitted and the method 100 proceeds to performing a UV exposure process as discussed below.

Referring to FIGS. 1A, 4, and 7, the method 100 performs a UV exposure process 232 to the workpiece 200 at operation 108, thereby forming an exposed bottom layer 204B that comprises a polymer network 330. As shown in FIG. 7, upon implementing the UV exposure process 232, the cross-linkers 304 and 308 (i.e., the UV-activated portions thereof) bonded to one polymer backbone 320 cross-link (i.e., form covalent bonds) with cross-linkers 304 and/or 308 bonded to a different polymer backbone 320. In other words, two polymer backbones 320 are cross-linked by the cross-linkers 304 and/or 308 to form the polymer network 330. In the present disclosure, the covalent bonds are represented by dotted lines to differentiate them from the chemical bonds between each cross-linker and its polymer backbone. In many embodiments, a cross-linker 304 may cross-link with another cross-linker 304 or, alternatively, with a cross-linker 308 (i.e., the UV-activated portion thereof). Similarly, a cross-linker 308 may cross-link with another cross-linker 308 or, alternatively, with a cross-linker 304.

The wavelength of the UV radiation implemented at operation 108 may be dependent upon the chemical composition of the cross-linkers 304 and/or 308. Specifically, the composition of the functional group R in the cross-linkers 306 and/or 308 may determine the wavelength of the UV radiation implemented at operation 108. In some embodiments, the wavelength ranges from about 160 nm to about 300 nm. Stability of different UV sources for producing having different wavelengths may vary and may affect the quality of the exposure process. As a result, in some embodiments, wavelengths corresponding to stable UV sources may be used as a parameter for selecting specific functional groups R suitable to be included in the cross-linkers 304 and/or 308.

In some instances, the extent of UV exposure may be non-uniform throughout the thickness of the bottom layer 204B. For example, if the substrate 202 includes features having spacing less than the wavelength of the UV radiation, the UV-activated cross-linkers in a bottom portion of the bottom layer 204B may not be adequately activated. Incomplete cross-linking (or curing) may affect the quality of the bottom layer 204B and the subsequent etching thereof. The present disclosure provides methods of implementing a thermal curing process following the UV exposure process 232 to impart additional cross-linking within the bottom layer 204B.

Referring to FIGS. 1A, 5, and 8, the method 100 performs a baking process 234 to the workpiece 200 at operation 110, thereby thermally curing the polymer network 330 to form the bottom layer 204C. In many embodiments, the baking process 234 thermally activates the cross-linkers 306 included in the polymer network 330. As shown in FIG. 8, upon implementing the baking process (or curing process) 234, the cross-linkers 306 and 308 (i.e., the thermally activated portions thereof) bonded to one polymer backbone 320 cross-link (i.e., form covalent bonds) with cross-linkers 306 and/or 308 bonded to a different polymer backbone 320. In many embodiments, a cross-linker 306 may cross-link with another cross-linker 306 or, alternatively, with a cross-linker 308 (i.e., the thermally activated portion thereof). Similarly, a cross-linker 308 may cross-link with another cross-linker 308 or, alternatively, with a cross-linker 306. In some embodiments, though not depicted herein, one cross-linker 308 may establish a UV-activated cross-link with a cross-linker 304 during the UV exposure process 232 and may subsequently form a thermally activated cross-link with a cross-linker 306 during the baking process 234. In some embodiments, the baking process 234 is implemented by heating the substrate 202 such that a bottom portion of the bottom layer 204C near or in contact with the substrate 202 is heated to a greater extent than a top portion of the bottom layer 204C. As such, the bottom portion of the bottom layer 204C that may be otherwise inaccessible to the UV curing at operation 108 (since the UV exposure is implemented in a top-down configuration) may be thermally cured (i.e., cross-linked), ensuring that the extent of curing in the bottom layer 204C is maximized throughout its thickness. In some embodiments, the baking process 234 is implemented at a temperature greater than the threshold temperature required to activate the cross-linker 306 and/or the thermally activated portion of the cross-linker 308. In some examples, depending upon the specific chemical composition of the cross-linkers 306 and/or 308, the baking process 234 may be implemented at a temperature from about 150 degrees Celsius to about 250 degrees Celsius. Other temperatures or ranges of temperatures may also be applicable.

Figure 9:
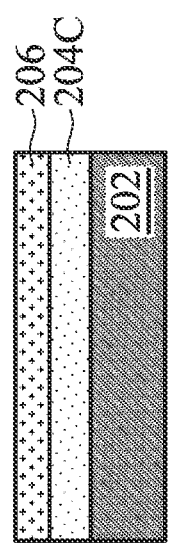

Referring to FIGS. 1B and 9, the method 100 forms a middle layer 206 (or a second layer) over the bottom layer 204 at operation 112. The middle layer 206 may be a single-layer structure or may include multiple layers each having a different composition. In many embodiments, the middle layer 206 has a composition that provides anti-reflective properties and/or hard mask properties for a subsequently implemented lithography process. The middle layer 206 may be formed by spin-coating a solution comprising a suitable polymer dissolved in a solvent for forming the middle layer 206 over the bottom layer 204, similar to the spin-coating process discussed above with reference to operation 104. In some embodiments, the operation 112 is omitted.

Figure 10:
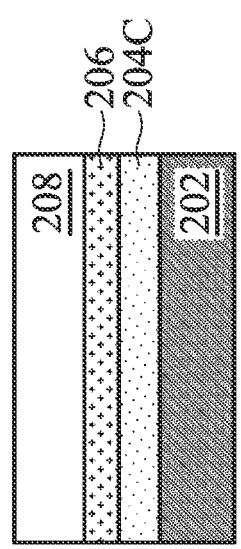

Referring to FIGS. 1B and 10, the method 100 forms a resist layer (hereafter referred to as a photoresist layer) 208 over the middle layer 206 at operation 114. The photoresist layer 208 may be a photosensitive layer operable to be patterned by an exposure process, which initiates a series of photochemical reactions in the photoresist layer 208. The photoresist layer 208 may include any suitable photosensitive resist material, and in many embodiments, the photoresist layer 208 includes a resist material sensitive to a radiation source (e.g., UV light, deep ultraviolet (DUV) radiation, and/or EUV radiation). However, the principles of the present disclosure apply equally to e-beam resists and other direct-write resist materials. The photoresist layer 208 may have a single-layer structure or a multi-layer structure. In many embodiments, regions of the photoresist layer 208 exposed to the radiation source undergo chemical reactions such that they decompose and become soluble in a developing solution. In alternative embodiments, exposed regions of the photoresist layer 208 undergo chemical reactions such that they polymerize and/or crosslink and become insoluble in a developing solution.

In many embodiments, the photoresist layer 208 comprises a polymer having a backbone (not shown) with a plurality of functional groups (not shown) attached thereto. The polymer backbone may include an acrylate-based polymer, a poly(norbornene)-co-maleic anhydride (COMA) polymer, a poly(hydroxystyrene)-based polymer, other suitable polymers, or combinations thereof having any number of functional groups that may assist one or more subsequent exposure and developing processes. In one example, the functional groups may include lithographically sensitive groups (e.g., sensitizers) such as phenol, styrene, fluoride, and/or other suitable groups. In another example, the functional groups may include acid-labile groups (ALGs) configured to be cleavable from the polymer backbone by an acidic moiety.

Furthermore, the photoresist layer 208 may be implemented with a chemical amplification (CA) resist material by including photosensitive moieties in the resist material's composition. For example, the photoresist layer 208 includes one or more photo-acid generators (PAGs) that produce acidic moieties in response to radiation exposure. Non-limiting examples of suitable PAGs include salts of sulfonium cations with sulfonates, salts of iodonium cations with sulfonates, sulfonyldiazomethane compounds, N-sulfonyloxyimide PAGs, benzoinsulfonate PAGs, pyrogallol trisulfonate PAGs, nitrobenzyl sulfonate PAGs, sulfone PAGs, glyoxime derivatives, triphenylsulfonium nonaflate, and/or other suitable PAGs now known or later developed. The photoresist layer 208 may additionally or alternatively include other photosensitive moieties such as photo-decomposable base (PDB), photo-base generator (PBG), photo-decomposable quencher (PDQ), other photosensitive moieties, or combinations thereof. The photoresist layer 208 may also include a number of additives such as cross-linking agents (e.g., tetramethylol glycoluril linker or epoxy linker), surfactant, chromophores, and/or solvents.

The photoresist layer 208 may be applied by any suitable technique, such as a spin-coating process as discussed above. The method 100 may implement a pre-exposure baking process to evaporate any remaining solvent applied during the spin-coating process.

Figure 11:
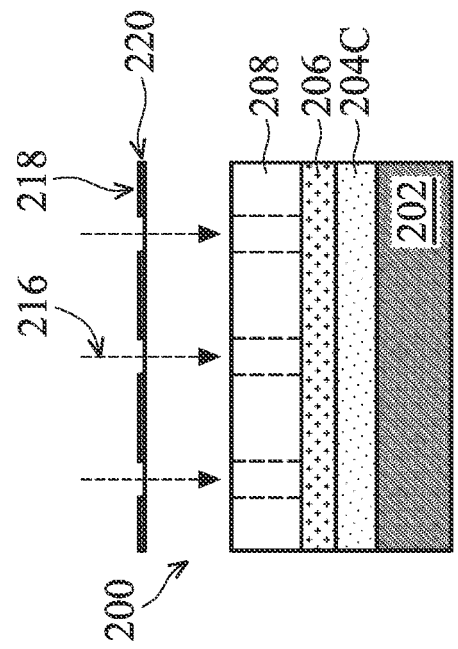

Referring to FIGS. 1B and 11, the method 100 exposes the photoresist layer 208 to radiation 216 at operation 116. In many embodiments, the radiation 216 may be an I-line (wavelength approximately 365 nm), a DUV radiation such as KrF excimer laser (wavelength approximately 248 nm) or ArF excimer laser (wavelength approximately 193 nm), an EUV radiation (wavelength ranging from about 1 nm to about 100 nm), an x-ray, an e-beam, an ion beam, and/or other suitable radiations. The exposure process at operation 110 may be performed in air, in a liquid (immersion lithography), or in vacuum (e.g., for EUV lithography and e-beam lithography). In the depicted embodiment, the method 100 implements a photolithography technique using a photomask 220 that includes a pattern 218. The photomask 220 may be a transmissive mask or a reflective mask, each of which may further implement resolution enhancement techniques such as phase-shifting, off-axis illumination (OAI) and/or optical proximity correction (OPC). In alternative embodiments, the radiation 216 is directly modulated with a predefined pattern, such as an IC layout, without using a photomask 220 (such as using an e-beam direct writer). In an example embodiment, the radiation 216 is EUV radiation and the exposure process at operation 110 is performed in a EUV lithography system. Correspondingly, a reflective photomask 220 may be used to pattern the photoresist layer 208. In many embodiments, the radiation 216 is implemented at a wavelength different from that of the UV exposure process 232. In example embodiments where the radiation 216 employs is EUV radiation, a wavelength of the radiation 216 is less than the wavelength of the UV radiation implemented at the UV exposure process 232 at operation 108.

Subsequently, referring to FIGS. 1B and 12, the exposed regions 212 of the photoresist layer 208 undergo photochemical reactions, while the unexposed regions 214 of the photoresist layer 208 remain substantially the same as the resist material prior to being exposed. In some embodiments, the material in the exposed regions 212 decomposes and becomes soluble in a developing solution. In alternative embodiments, the material in the exposed regions 212 of the photoresist layer 208 polymerizes and/or cross-links and become insoluble in a developing solution. In the depicted embodiment, the resist material prior to being exposed is chemically amplified such that the chemical reactions brought about by the exposure process are initiated by one or more photosensitive moieties, which subsequently trigger further reactions in the material in the exposed regions.

Referring to FIGS. 1B and 13, the method 100 implements a developing process on the workpiece 200 at operation 118. The developing process dissolves or otherwise removes either the exposed regions 212 (referring to FIG. 14B) or the unexposed regions 214 (referring to FIG. 14A) depending upon the specific chemical changes occurred during the exposure process at operation 110 and the nature of the developer used. Suitable water-based developers include tetramethyl ammonium hydroxide (TMAH), KOH, NaOH, and/or other suitable solvents, and suitable organic solvent-based developers include solvents such as n-butyl acetate, ethanol, hexane, benzene, toluene, and/or other suitable solvents. Applying the developer 222 may include spraying the developer 222 on the photoresist layer 208 by a spin-coating process. The developing process at operation 112 may begin with a post-exposure baking process. Depending on the polymer(s) included in the photoresist layer 208, the post-exposure baking process may catalyze a reaction between the reacted photosensitive moieties and the polymer in the photoresist layer 208.

Referring to FIG. 1B, the method 100 performs additional fabrication processes at operation 120 that includes, for example, transferring the pattern formed in the photoresist layer 208 to the underlying middle layer 206 and the bottom layer 204C in one or more etching processes. The etching processes may be implemented by any suitable method including a dry etching process, a wet etching process, other suitable etching process, a reactive ion etching (RIE) process, or combinations thereof. Subsequently, the substrate 202 may be processed using the patterned bottom layer 204C as a mask. Any suitable method may be performed to process the substrate 202 including a deposition process, an implantation process, an epitaxial growth process, and/or any other fabrication process. In an example embodiment, the substrate 202 is etched using the patterned bottom layer 204C as an etch mask. However, embodiments of the present disclosure apply to any fabrication process performed on the substrate 202. In various examples, patterned bottom layer 204C is used as a mask to fabricate a gate stack, an interconnect structure, non-planar devices (fins) by etching or by epitaxially growing fin material, and/or other suitable structures in the substrate 202. After the substrate 202 has been processed, the patterned photoresist layer 208, the patterned middle layer 206, and the patterned bottom layer 204C are removed from the substrate 202. In some embodiments, the patterned bottom layer 204C is removed together with the patterned photoresist layer 208 and/or the patterned middle layer 206 by any suitable process, such as plasma ashing or resists stripping. Alternatively, the pattered bottom layer 204C may be removed by an etching process, such as a dry etching process, a wet etching process, an RIE process, and/or other suitable etching processes, after the patterned photoresist layer 208 and the patterned middle layer 206 are removed from the workpiece 200 by a suitable method.

In many embodiments, following the operation 120, the workpiece 200 may be used to fabricate an integrated circuit chip, a system-on-a-chip (SOC), and/or a portion thereof, and thus the subsequent fabrication processes may form various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, other types of transistors, and/or other circuit elements.

Various advantages may be present in one or more embodiments of the methods, devices, and compositions described herein. The present disclosure provides a bottom layer (e.g., a BARC) formed over a substrate and configured to facilitate lithographic patterning processes. Specifically, the bottom layer may include a network of polymers having at least one UV cross-linker and at least one thermal cross-linker bonded thereto. In some embodiments, the present disclosure provides a method during which the bottom layer undergoes a UV exposure to activate the UV cross-linker followed by a heat exposure to activate the thermal cross-linker, before performing a lithographic patterning process that includes forming, exposing, and developing a photosensitive top layer formed over the bottom layer. In many embodiments, incorporating both UV-activated cross-linkers and thermally activated cross-linkers in the bottom layer provides additional cross-linking sites to the network of polymers, thereby improving the extent of curing after the bottom layer is subjected to both UV and heat exposure configured to activate their respective cross-linkers.

In one aspect, the present disclosure provides a method that begins with forming a bottom layer over a semiconductor substrate, where the bottom layer includes a polymer bonded to a first cross-linker and a second cross-linker, the first cross-linker being configured to be activated by ultraviolet (UV) radiation and the second cross-linker being configured to be activated by heat at a first temperature. The method proceeds to exposing the bottom layer to a UV source, resulting in an exposed bottom layer, where the exposing activates the first cross-linker. The method further includes subsequently baking the exposed bottom layer, where the baking activates the second cross-linker.

In another aspect, the present disclosure provides a method that begins with spin-coating a semiconductor substrate with a material layer that includes a polymer attached to a UV cross-linker and a thermal cross-linker, where an amount of the UV cross-linker in the material layer is greater than an amount of the thermal cross-linker in the material layer. The method proceeds to exposing the material layer to a first UV source having a first wavelength to form an exposed material layer, where the exposing induces cross-linking of the UV cross-linker, followed by thermally curing the exposed material layer to form a cured material layer, where the curing induces cross-linking of the thermal cross-linker and subsequently forming a photoresist layer over the cured material layer.

In yet another aspect, the present disclosure provides a method that begins with forming a bottom layer over a semiconductor substrate, the bottom layer including a polymer, a first cross-linker configured to cross-link under ultraviolet (UV) exposure, and a second cross-linker configured to cross-link under heat exposure at a first temperature, where the first and the second cross-linkers are bonded to the polymer. The method proceeds to performing a first heat exposure to the bottom layer at a second temperature lower than the first temperature, followed by performing a UV exposure to the bottom layer to induce cross-linking of the first cross-linker to result in an exposed bottom layer, and performing a second heat exposure to the exposed bottom layer at a third temperature to result in a cured bottom layer, where the third temperature is higher than the first temperature. Subsequently, the method forms a middle layer over the cured bottom layer and a photoresist layer over the middle layer.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A polymer comprising:
   a plurality of first cross-linkers activatable by ultraviolet (UV) exposure;
   a plurality of second cross-linkers activatable by heat exposure;
   a plurality of hybrid cross-linkers activatable by both UV exposure and heat exposure; and
   a polymer backbone bonded to the plurality of first, second, and hybrid cross-linkers, wherein a total amount of second cross-linkers bonded to the polymer backbone is smaller than a total amount of first cross-linkers bonded to the polymer backbone.

2. The polymer of claim 1, wherein each of the first cross-linkers include $H_2C=CH-R-$, wherein R includes $-(C=O)-$, $-(C=O)-O-$, $-CH=CH-$, phenyl, phenol, or combinations thereof.

3. The polymer of claim 2, wherein each of the second cross-linkers includes phenyl, alkyl-substituted phenyl, epoxy, hydroxyl, ether, ester, novolac, or combinations thereof.

4. The polymer of claim 1,
   wherein each of the hybrid cross-linkers includes $H_2C=CH-R-X$,
   wherein R includes $-(C=O)-$, $-(C=O)-O-$, $-CH=CH-$, phenyl, phenol, or combinations thereof,
   wherein X includes an alkyl chain, an aromatic ring, a heteroaromatic ring, or combinations thereof.

5. The polymer of claim 1, wherein a total amount of second cross-linkers bonded to the polymer backbone is smaller than a total amount of hybrid cross-linkers bonded to the polymer backbone.

6. The polymer of claim 5, wherein a total amount of the second cross-linkers in the polymer is about 25% to about 67% of a total amount of the first and the hybrid cross-linkers in the polymer.

7. The polymer of claim 1, wherein the plurality of first cross-linkers is configured to crosslink with cross-linkers of another polymer such that when exposed to the UV exposure, one of the plurality of first cross-linkers bonds to a first cross-linker of another polymer and another one of the plurality of first cross-linkers bonds to a hybrid cross-linker of another polymer.

8. The polymer of claim 7, wherein the UV exposure is from a UV source having a wavelength ranging from about 160 nm to about 300 nm.

9. The polymer of claim 1, wherein the plurality of second cross-linkers is configured to crosslink with cross-linkers of another polymer such that when exposed to the heat exposure, one of the plurality of second cross-linkers bonds to a second cross-linker of another polymer and another one of the plurality of second cross-linkers bonds to a hybrid cross-linker of another polymer.

10. The polymer of claim 1, wherein the heat exposure is from a heat source having a temperature ranging from about 150 degrees Celsius to about 250 degrees Celsius.

11. A method comprising:
forming a bottom layer over a semiconductor substrate, wherein the bottom layer includes a polymer backbone bonded to a first cross-linker, a second cross-linker, and a hybrid cross-linker, wherein the first cross-linker is activatable by ultraviolet (UV) radiation, wherein the second cross-linker is activatable by heat at a first temperature, and wherein the hybrid cross-linker is activatable by both the UV radiation and the heat;
exposing the bottom layer to a first UV source, resulting in an exposed bottom layer, wherein the exposing activates the first cross-linker and a first portion of the hybrid cross-linker; and
baking the exposed bottom layer at the first temperature, resulting in a cured bottom layer, wherein the baking activates the second cross-linker and a second portion of the hybrid cross-linker,
wherein a bottom portion of the exposed bottom layer is heated by the baking to a greater extent than a top portion of the bottom layer.

12. The method of claim 11, further comprising:
forming a photoresist layer over the cured bottom layer; and
exposing the photoresist layer to a second UV source, wherein the first UV source has a wavelength different from that of the second UV source.

13. The method of claim 12, wherein the first UV source is UV light, and the second UV source is deep ultraviolet (DUV) or extreme ultraviolet (EUV) radiation.

14. The method of claim 11, wherein, before exposing the bottom layer to the first UV source, baking the bottom layer at a second temperature lower than the first temperature.

15. The method of claim 11, wherein the first cross-linker and the first portion of the hybrid cross-linker include $H_2C=CH-R-$, and wherein R includes $-(C=O)-$, $-(C=O)-O-$, $-CH=CH-$, phenyl, phenol, or combinations thereof.

16. The method of claim 15, wherein the second cross-linker and the second portion of the hybrid cross-linker include phenyl, alkyl-substituted phenyl, epoxy, hydroxyl, ether, ester, novolac, or combinations thereof.

17. A method comprising:
forming a bottom layer over a semiconductor substrate, wherein the bottom layer includes a polymer backbone bonded to a first cross-linker, a second cross-linker, and a hybrid cross-linker, wherein the first cross-linker is activatable by ultraviolet (UV) radiation, wherein the second cross-linker is activatable by heat, and wherein the hybrid cross-linker is activatable by both UV radiation and heat;
baking the bottom layer at a first temperature, resulting in a baked bottom layer;
exposing the baked bottom layer to a first UV source at a first wavelength, resulting in an exposed bottom layer, wherein the exposing activates the first cross-linker and a first portion of the hybrid cross-linker;
baking the exposed bottom layer at a second temperature higher than the first temperature, resulting in a cured bottom layer, wherein the baking activates the second cross-linker and a second portion of the hybrid cross-linker;
forming a photoresist layer over the cured bottom layer; and
exposing the photoresist layer to a second UV source at a second wavelength less than the first wavelength; and
baking the photoresist layer after the exposing of the photoresist layer.

18. The method of claim 17, further comprising forming a middle layer between the exposed bottom layer and the photoresist layer, wherein the middle layer provides anti-reflective properties.

19. The method of claim 17, further comprising:
removing a portion of the photoresist layer to form a patterned photoresist layer; and
patterning the cured bottom layer through the patterned photoresist layer.

20. The method of claim 17, wherein the hybrid cross-linker includes functional groups of the first and the second cross-linkers.

* * * * *